United States Patent [19]

Macovski

[11] Patent Number: 4,486,708
[45] Date of Patent: Dec. 4, 1984

[54] SELECTIVE MATERIAL PROJECTION IMAGING SYSTEM USING NUCLEAR MAGNETIC RESONANCE

[76] Inventor: Albert Macovski, 2505 Alpine Rd., Menlo Park, Calif. 94025

[21] Appl. No.: 332,926

[22] Filed: Dec. 21, 1981

[51] Int. Cl.³ ............................................. G01R 33/08
[52] U.S. Cl. ....................................... 324/309; 324/312
[58] Field of Search ................ 324/300, 307, 309, 312

[56] References Cited

U.S. PATENT DOCUMENTS

4,021,726  5/1977  Garroway ........................... 324/312
4,354,157 10/1982  Feiner .................................. 324/309

Primary Examiner—Michael J. Tokar
Attorney, Agent, or Firm—Flehr, Hohbach, Test, Albritton & Herbert

[57] ABSTRACT

Two-dimensional projection measurements are formed of the NMR activity within a volume. These represent different properties of the materials within the volume including density, the longitudinal relaxation time and the spin-spin relaxation time. The measurements of the different properties are processed to produce projection images of specific materials within the volume. Projection images are also obtained of specific regions within the volume.

26 Claims, 7 Drawing Figures

SELECTIVE MATERIAL PROJECTION IMAGING SYSTEM USING NUCLEAR MAGNETIC RESONANCE

BACKGROUND OF THE INVENTION

1. Field of the Invention

This invention relates to medical imaging systems using nuclear magnetic resonance. In a primary application the invention relates to projection imaging of specific materials having unique NMR properties.

2. Description of Prior Art

Nuclear magnetic resonance, abbreviated NMR, represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pick-up coils. By manipulating the magnetic fields, an array of signals are provided representing different regions of the volume. These are combined to produce a volumetric image of the density of the body.

A descriptive series of papers on NMR appeared in the June 1980 issue of the *IEEE Transactions on Nuclear Science*, Vol. NS-27, pp. 1220-1255. The basic concepts are described in the lead article, "Introduction to the Principles of NMR" by W. V. House, pp. 1220-1226.

A number of three-dimensional methods are described. One important one is described by P. V. Lauterbur and C. M. Lou entitled, "Zeugmatography by Reconstruction from Projections," pp. 1227-1231. In this approach, a linear field gradient is superimposed on the strong axial magnetic field. As a result of the gradient, each plane in the volume, in a direction normal to the gradient, experiences a different resonant frequency. A burst, containing a spectrum of frequencies, is used to simultaneously excite each of the planes. The received signal, following the excitation, is then Fourier transformed into its individual components. The amplitude at each frequency represents a planar integration of the proton density. This process can be repeated using a gradient field in different directions to collect information about arrays of planes. These planar integrals can be used to produce two-dimensional projection images of a volume or, alternatively, three-dimensional information about the proton density of each voxel in the volume.

The projection image is obtained by obtaining the integrated density of substantially all planes which are normal to the plane of the projection image. The total number of planes required, at all angles and positions, is substantially equal to the number of pixels in the two-dimensional projection image. The reconstruction procedure involves the classical reconstruction from projections widely used in current computerized tomography systems. The most generally used procedure is that of convolution-back projection.

The resultant two-dimensional projection images have a number of drawbacks and, as a result, are not used. Firstly, the superimposed intervening structures make it very difficult to visualize the desired structure, be it an organ or tumor. Secondly, the nature of this imaging procedure is such that all of the measurements affect every reconstructed pixel. This makes the image particularly sensitive to motion. Any motion of the object will cause artifacts in the image due to inconsistencies where the object does not match its projections. These artifacts can often obscure the desired information.

To avoid the problems of intervening structures, three-dimensional reconstructions are made which provides cross-sectional images. The approach taken in the Lauterbur paper involves making an array of two-dimensional projection images at every angle through the object. Lines in these projection images represent line integrals or projections of cross-sectional planes of the object. This, again using classical reconstruction techniques, any desired cross-sectional plane can be reconstructed. The intermediate two-dimensional projections are not used for the reasons discussed.

Although these cross-sectional images are free of intervening structures, they are unsuitable for many medical problems. The cross-sectional format is often difficult to interpret. In addition, the acquisition of three-dimensional data takes a relatively long time, thus resulting in a variety of artifacts due to the various physiological motions of the body.

A second general method of acquiring and processing NMR imaging data is described in a paper by E. R. Andrew entitled "Nuclear Magnetic Resonance Imaging: The Multiple Sensitive Point Method" pp. 1232 to 1238 of the same issue. In this method, a selective system is used which acquires data from individual voxels in the volume of interest. This is accomplished using dynamically varying fields for the gradients. In general, with these dynamic fields, all but the small region not containing the time-varying field integrates to zero. Thus, if time varying fields of different frequencies are applied to three orthogonal axes, only a single point or voxel will not be time-varying. The signal will therefore represent solely that point without requiring reconstruction from projections.

The difficulty with this system is that it requires a very long data acquisition time since the signal is taken from one voxel at a time. Sufficient time must be spent at each voxel to provide an adequate signal to noise ratio. This problem is alleviated by using dynamic gradients on two axes and a static gradient on the third axis. Thus, in the direction of the third axis, each position again corresponds to a different frequency. Using wide-band excitation and Fourier transforming the received signal the frequency spectra simultaneously provide the density of an array of voxels along a line. The line is that corresponding to the intersection of the two orthogonal dynamic gradients where all but a single line averages to zero.

Although this method avoids the motion artifacts caused by reconstruction from projections, it continues to provide a relatively long data acquisition time with the resulting blurring from physiological motions including respiratory and cardiovascular. In addition it is a three-dimensional imaging system which provides cross-sectional images.

A third imaging method is also line or point selective and is described in a paper by L. E. Crooks entitled, "Selective Irradiation Line Scan Techniques for NMR Imaging" of pp. 1239-1244 of the same issue. This general approach has a number of variations. In one, a selective pulse is used to excite a single plane of interest using a static gradient and an appropriately shaped pulse. The resulting signal from the excited plane is stored. Following equilibrium an orthogonal plane is excited with a higher intensity such that the magnetization is inverted or made negative. Irradiation of this type produces no received signal. The first step is then repeated by selectively exciting the plane of interest and storing the resultant signal. In this case, however, a line in the plane of interest will be missing since it has been saturated by the high intensity excitation of a plane orthogonal to the plane of interest. Thus the line of intersection is not included in the resultant signal. A simple subtraction of the first and second stored signals represents the line of intersection. By measuring different lines at many angles and positions in the plane of interest, using this subtraction procedure, a reconstructed image of the plane is made using classical reconstruction from projection techniques.

An alternative approach using the same line intersection of orthogonal planes avoids the subtraction operation. In this case the orthogonal plane is immediately excited with inverting radiation. The line of intersection is affected so as to produce a spin echo signal at a later time. Thus, at this later time, the signal represents the desired line only. Again, an array of line intergral signals are used to provide a cross-sectional image.

Similar sensitive point and sensitive line methods have been suggested which results in saturation of all but a specific plane of interest. This is immediately followed by a similar excitation in an orthogonal direction which saturates everything in the plane except a line. Either the line integral signal can be acquired, or a third orthogonal excitation can be used to acquire the signal from a point or voxel. Saturation is achieved by a relatively long "burn" radio frequency pulse, in the presence of a gradient, which demagnetizes the region corresponding to the frequencies excited. This procedure is described in a paper by A. N. Garroway, P. K. Grannel and P. Mansfield, "Image Formation in NMR by a Selective Irradiative Process," which appeared in *J. Phys. C: Solid State Physics*, Vol. 27, 1974, pp. L457–L462.

An additional approach to NMR imaging is described in a recent book entitled *Nuclear Magnetic Resonance Imaging In Medicine*, published in 1981 by Igaku-Shoin, Ltd., Tokyo. Chapter 3 of this book, by Lawrence E. Crooks, provides an overview of the various imaging techniques. In addition to those already mentioned there is another planar integration approach described on pp. 44–47. Here, each plane integral is phase encoded by applying a gradient normal to the plane. When the gradient is removed, the nuclei along the plane have cyclical phase distributions, depending on the strength of the magnetic field. By acquiring these planar integrals using phase distributions with different spatial frequencies, information is acquired about each line in the plane. This information is decoded again using Fourier transforms. This approach has been termed spin warp imaging.

Each of the data acquisition systems described can be used to measure density, the longitudinal relaxation time $T_1$ and the spin-spin relaxation time $T_2$. As described in the previously referenced book, *Nuclear Magnetic Resonance Imaging in Medicine*, the density information can be acquired using an excitation which rotates the magnetic moment by 90°, and measuring the free induction decay or FID signal. $T_1$ can be measured by inverting the magnetic moment with a 180° excitation, and then following it with a 90° excitation whereby the resultant signal will be determined by the amount of decay. Alternatively, two 90° excitations, separated by a time less than $4T_1$, will result in signals whose amplitude differences can be used to determine $T_1$. The decay time of the FID signal cannot directly be used to measure $T_2$ since the inhomogeneity of the fields cause a rapid decay. However, if 180° inversion excitations are periodically applied, these serve to cancel the effects of the field inhomogeneity. If the amplitudes of the spin echos following these inversion excitations are observed and compared to the initial FID signal following the 90° excitation, the decay is indicative of $T_2$. A variety of equivalent methods have been described for the measuring of the components. Cross-sectional images have been made of each of these components.

Thusfar images have been made essentially of hydrogen, with its single proton nucleus. Other elements and isotopes have insufficient activity to produce cross-sectional images in a reasonable time. These elements have been studied, however, in non-imaging situations where the material content of a volume of interest is evaluated. It would be highly desirable, however, to provide images of other materials for a variety of applications including the study of metabolism.

SUMMARY OF THE INVENTION

An object of this invention is to provide NMR projection images of specific materials within the body.

A further object of this invention is to provide isolated NMR projection images of the body with substantially reduced data acquisition time.

A further object of this invention is to provide NMR images with reduced sensitivity to image artifacts.

A further object of this invention is to provide NMR projection images

A further object of this invention is to provide NMR images with substantially higher resolution.

A further object of this invention is to provide NMR images of materials other than hydrogen.

A further object of this invention is to provide NMR images of the projection of specific portions of a volume.

Briefly, in accordance with the invention, two-dimensional projection images are formed representing different NMR components within the body. These are processed to produce projection images of specific materials, with the intervening materials removed. Also, projection images are obtained of specific regions within the body.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
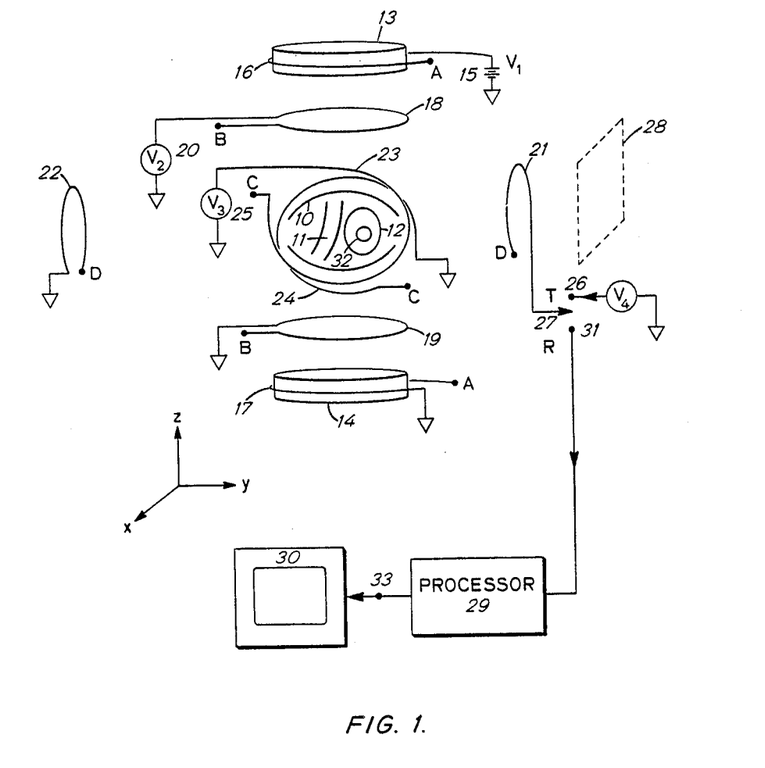
FIG. 1 is a schematic drawing illustrating an embodiment of the invention.

An understanding of the broad aspects of the invention may best be had by reference to FIG. 1. Here it is desired to selectively image specific features of the anatomy in volume 10 of the human body. For example, 11 can represent a bone structure which it is desired to visualize. Alternatively, bone structure 11 may be interfering with the visualization of soft tissue structure 12, which can represent the liver, kidneys, brain, etc. Also, it is often important to visualize regions of disease such as is illustrated by tumor 32 imbedded in soft tissue structure 12.

The methods employed in accomplishing these imaging tasks using NMR have thusfar employed cross-sectional imaging. This format is used since it avoids the problem of intervening structures. However, these approaches have many limitations including relatively long data acquisition time, poor resolution, poor SNR and a limited field of view. Although these parameters can be traded off, such as obtaining better resolution or SNR at the expense of a longer data acquisition time, the overall performance remains marginal.

Many of these problems can be solved by obtaining projection rather than cross-sectional images. These have a field of view encompassing the entire volume of interest. Also, since many fewer measurements are fundamentally required, systems with much shorter acquisition times, higher resolution and improved SNR can be structured.

The fundamental problem with these systems, as with all projection imaging, is that of intervening material obscuring the region of interest. In this invention, however, we provide methods of selectivity removing undesired intervening structures so that projection images are obtained of solely the region of interest, with all of the associated advantages.

We will first describe the systems for selectively imaging portions of volume 10 and then describe the various projection imaging systems that can be used. In general, however, the principle axial magnetic field is produced using, for example, pole pieces 13 and 14 excited by coils 16 and 17. These are driven by a d.c. source $V_1$ with the coils 16 and 17 producing fields in the same direction to create a substantially uniform field throughout the region of interest in volume 10. This is by far the strongest field in the system with a strength of the order of one kilogauss. With both this coil and the remaining coils, the letter pairs A-D are simply convenient ways of indicating connections.

Specific regions are selected using the gradient coils. Coils 18 and 19 form a gradient field in the z direction driven by 20, source $V_2$. Similarly coils 23 and 24 are on opposite sides of object 10 and thus form a gradient field in the x direction driven by 25, source $V_3$. Unlike coils 16 and 17 which create a uniform field, these gradient coils are bucking each other so as to produce a varying field in the respective direction.

Coils 21 and 22 are the radio frequency coils serving both the transmitter and receiver functions. They produce fields in the same direction to create a substantially uniform field in volume 10. When switch 27 is in the transmit position, 26, generator $V_4$, is used to excite the magnetic spins in volume 10. When switch 27 is connected to the receive position, signal 31 is received from magnetic spin signals in volume 10. These are processed in processor 29 to provide a projection image of specific materials in volume 11. The resultant projection image is displayed in display 30. This is a projection of volume 10 onto plane 28.

A variety of combinations of excitation signals $V_4$ and processing systems 29 can be used to isolate specific materials, organs or lesions in volume 10. The projections of these isolated structures, projected onto plane 28, are displayed in display 30.

Using specific excitations projections of the volume are obtained which are functions of $\rho$, $T_1$, and $T_2$, which are respectively the spin density, the spin-lattice or longitudinal relaxation time and the spin-spin or transverse relaxation time. Each material has a unique set of these three parameters. We can make a sequence of measurements, each of which represents the projection of one or more of these materials. Functionally, these can be described as $f_n(\rho, T_1, T_2)$ where $f_n$ is some function of one or more of these parameters. In general, a number of measurement techniques are used to provide different functional relationships $f_n$ of these parameters. These can then be combined to, for example, eliminate any material k which has a given set $\rho_k$, $T_{1k}$ and $T_{2k}$. Similarly, they can be combined to enhance and/or isolate any material which has a given set of these parameters. This capability allows projection imaging to be used to its fullest advantage; by isolating the region of interest and removing intervening structures.

As an example, assume there are two materials in the projection path in volume 10, material A and material B. Using one of the projection imaging systems to be described, we excite the volume with an excitation which rotates the magnetic moment by the classical 90°. The resultant projection along the y axis of the free induction decay signal received is given by

$$I_1 = \int \rho \, dy$$
$$= \rho_a Z_a + \rho_b Z_b,$$

where $\rho_a$ and $\rho_b$ are the densitites of the two materials and $Z_a$ and $Z_b$ are the path lengths in the y direction. Thus $Z_a$ and $Z_b$ are functions of x and z. Our desired isolated projection images are $Z_a(x,z)$ and $Z_b(x,z)$ since they represent the projections of specific materials. As the first step in isolating these projection images we store the projected measurement $I_1(x,z)$ in processor 29.

We then make a second measurement which includes a function of $T_1$. This can be accomplished by first exciting the volume with a 180° inversion excitation. This produces no FID signal. Then, after a time $t_a$, a 90° excitation is applied. The intensity of the received signal is given by $$I_2 = \int \rho [1 - 2e^{-t_a/T_1}] dy$$
$$= \rho_a [1 - 2e^{-t_a/T_{1a}}] Z_a + \rho_b [1 - 2e^{-t_a/T_{1b}}] Z_b.$$

We thus have two equations representing the measured values $I_1(x,z)$ and $I_2(x,z)$ in terms of the two unknowns $Z_a(x,z)$ and $Z_b(x,z)$. The constants $\rho_a$, $\rho_b$, $T_{1a}$ and $T_{1b}$ are known for the material of interest such as bone, soft tissue, etc. Solving these equations, we have $$Z_a(x,y) = \frac{I_2 - I_1 G_b}{\rho_a [G_a - G_b]}$$

where

-continued $$G_1 = [1 - 2e^{-t_a/T_1}].$$

Thus a separate isolated image is formed of two-dimensional projection of material A. Similarly the $Z_b$ image is given by $$Z_b(x,y) = \frac{I_1 - p_a Z_a}{p_b}.$$

Once the $Z_a$ and $Z_b$ images are isolated, they can be used to cancel specific materials which are mixtures of these two components. For example, assume a lesion or organ material has a ratio r of $Z_a$ to $Z_b$. Then an image with this lesion cancelled $Z_1$ can be provided as given by $$Z_1 = Z_a - rZ_b.$$

In addition to cancelling some specific material, this approach can also be used for evaluating an unknown material, such as in determining whether a tumor is benign or malignant. A control can be placed on the ratio r. While observing the display, the clinician can vary this control until the lesion disappears. The resultant ration r is indicative of the material properties of the tumor.

We have thusfar dealt with signals representing two material properties, $\rho$ and $T_1$. The transverse or spin-spin relaxation time $T_2$ is measured by first using a 90° excitation for $V_4$ providing a free induction decay. The intensity of this signal is the previously indicated $I_1$. After a time $t_b$, a 180° inversion is applied. This causes those signal phases caused by nonuniform magnetic fields to reverse and begin to move in phase, producing a spin echo signal at $2t_b$. The intensity of this signal $I_3$ is given by $$I_s = \int \rho e^{-2t_b/T_2} dy$$

$$= p_a e^{-2t_b/T_{2a}} Z_a + p_b e^{-2t_b/T_{2b}} Z_b$$

$$= p_a H_a Z_a + p_b H_b Z_b,$$

where $$H_i = \exp[-2t_b/T_{2i}].$$

This additional piece of information can also be used to obtain isolated images of $Z_a(x,y)$ and $Z_b(x,y)$. More important, it can be used to isolate a third material $Z_c$. For example, the three measurements $I_1$, $I_2$, and $I_3$ can be used to make isolated projection images of the bone 11, soft tissue organ 12 and tumor 32 in volume 10.

Using matrix notation, the vector of intensity measurements is described by $$\overline{I} = \overline{MZ}$$

where I is the measurement vector.

$$\begin{bmatrix} I_1 \\ I_2 \\ I_3 \end{bmatrix}$$

$\overline{M}$ is the measurement matrix, $$\begin{bmatrix} p_a & p_b & p_c \\ p_a G_a & p_b G_b & p_c G_c \\ p_a H_a & p_b H_b & p_c H_c \end{bmatrix}$$

and $\overline{Z}$ is the material vector $$\begin{bmatrix} Z_a \\ Z_b \\ Z_c \end{bmatrix}.$$

The solution to the three isolated material images is simply $$\overline{Z} = \overline{M}^{-1} \overline{I}$$

where $\overline{M}^{-1}$ is the inverse of matrix $\overline{M}$, the solution to the three simultaneous equations.

Figure 2A:
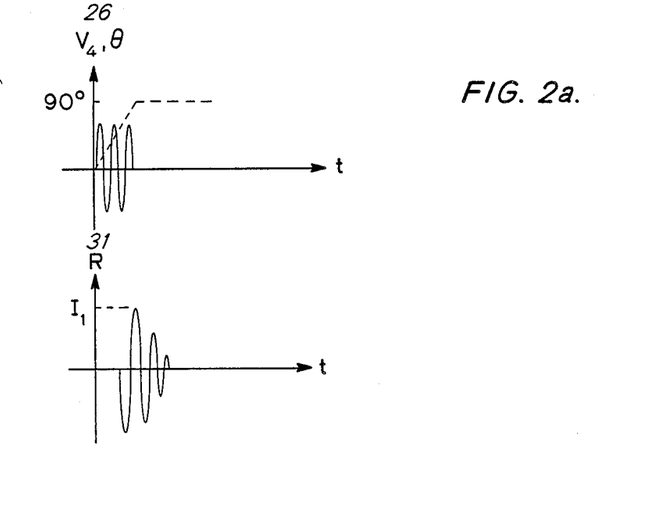
FIGS. 2a, 2b and 2c are graphs of excitation signals, the accompanying angle of the magnetic moment and the resultant received signals.
Figure 2B:
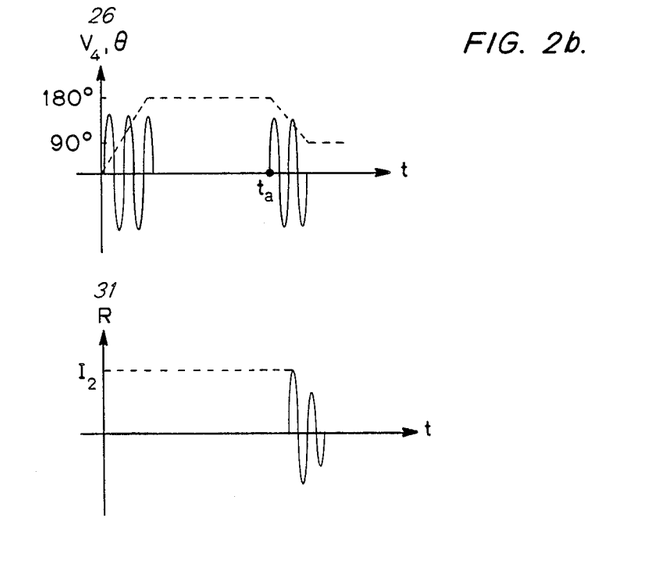
Figure 2C:
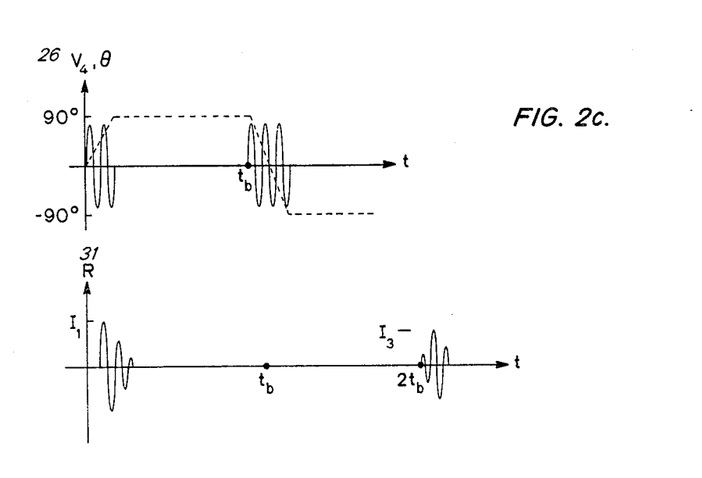
Figure 3:
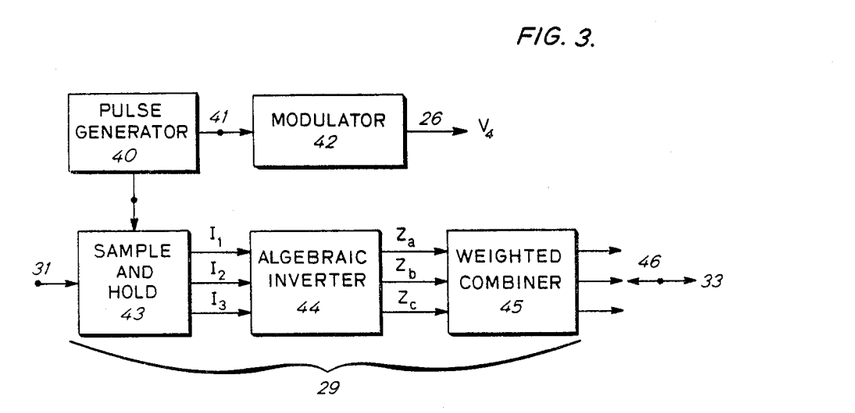
FIG. 3 is a block diagram of an embodiment of a signal processing system.

The specifics of this system is illustrated in FIGS. 2 and 3 where the waveforms are generated as shown in FIGS. 2a, 2b and 2c. As indicated in FIG. 3, pulse generator 40 produces various pulse sequences 41. These are used to provide modulated ratio frequency bursts which provide the excitation waveforms $V_4$. These radio frequency bursts can either be narrowband or wideband depending on the type of imaging system used. These will be subsequently discussed.

FIG. 2 illustrates the pulse sequences $V_4$, the associated angles of the magnetic moment $\theta$ and the resultant received signals 31. As shown in FIG. 2a, a burst from modulator 42 results in a 90° excitation signal. Following this burst switch 27 is moved from the transmit position 26 to the receive position 31. The switching can be controlled by pulse generator 42. The received free induction decay signal is shown in FIG. 2a indicating the line integral of the density. Pulse 47 is applied to sample and hold structure 43 which records the peak amplitude of the free induction decay signal $I_1$ and stores it.

Similarly, as previously described, a measurement related to $T_1$ is obtained as shown in FIG. 2b using a 180° excitation burst followed, after a time $t_a$ by a 90° burst. The peak of the resultant FID signal $I_2$ is again sampled and stored.

FIG. 2c illustrates the sequence used to develop a measurement indicative of $T_2$. Here, as in FIG. 2a, a 90° excitation pulse is used. The resultant FID signal can be ignored or it can be measured as an alternative method of deriving $I_1$. Following a time interval $t_b$, pulse generator 40 and modulator 42 are used to produce a 180° inversion excitation. This causes the misphased spins to reverse and begin to form in phase. The spins realign at time $2t_b$ producing a spin echo signal. The peak of this signal $I_3$ is stored in sample and hold system 43.

Many other combinations of pulse sequences can be used to obtain three signals, $I_1$, $I_2$ and $I_3$, which represent various functions of the projections of $\rho$, $T_1$ and $T_2$. These three stored signals are applied to algebraic inverter 44 which solves the linear algebra problem, inverting the matrix, and producing the three material images. These images can be displayed directly in display 30. These could represent, for example, bone, liver, and a type of tumor. Alternatively, weighted sums or differences of these basic materials can be combined in combiner 45 to enhance or cancel any desired material.

In the foregoing analysis the measured intensities $I_i$ were indicated as being equal to various physical properties of the materials. Clearly this equality is within a proportionality factor which depends on the specific configuration used.

When making projection images of moving materials, such as moving blood in a vessel, the effective parameters of the moving blood, $\rho$, $T_1$ and $T_2$ experience significant changes. This makes it possible to cancel all material, such as bone and soft tissue, except the moving blood. The resultant images are isolated projection images of blood vessels. These are very significant in the diagnosis of stenosis or narrowings of vessels which is a major disease.

Existing NMR images are essentially all of the hydrogen nucleus or protons. Attempts at imaging other elements are considered in Chapter 9 of the previously referenced book, *Nuclear Magnetic Resonance Imaging In Medicine*. This chapter is written by David M. Kramer. The principle difficulty is the reduced NMR activity for the other elements of interest. In order to obtain a reasonable SNR, extensive integration times and reduced resolution is required. These requirements have thusfar prevented the clinical application of imaging other than hydrogen. Some experimental studies have been made of the more promising elements including isotopes of nitrogen, phosphorus, sodium, oxygen, carbon, potassium, chlorine and fluorine.

In projection imaging the number of measurements is drastically reduced and the volume of material in each measurement is significantly increased. This overall increase in effective sensitivity makes the imaging of other elements much more effective, although some increase in acquisition time and/or reduction in resolution may be required. The use of other elements provides additional independent parameters about each material in the body and allows a finer degree of enhancement, cancellation, or identification of various organs and lesions. We make use of the basic equation $$\omega_o = \gamma H$$

where $\omega_o$ is the nuclear resonant frequency and H the local magnetic field. The parameter $\gamma$ depends on the specific element or isotope used. Thus each isotope produces a different frequency. Each element or isotope will have its own $\rho$, $T_1$ and $T_2$ parameters as previously described. Therefore, for each new element or isotope measured, we have three additional independent parameters defining the material.

Figure 4:
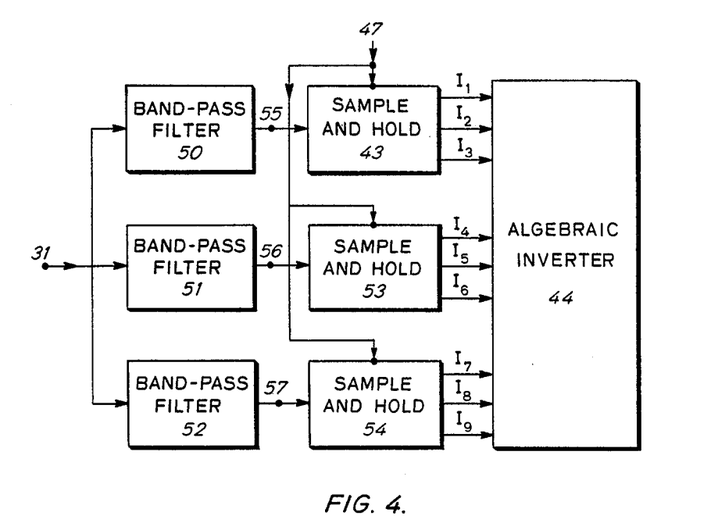
FIG. 4 is a block diagram of an embodiment of a multiple-frequency signal processing system.

As shown in FIG. 4, received signal 31 is applied to bandpass filters 50, 51 and 52. These each have center frequencies corresponding to the element or isotope being imaged. These are passed onto sample and hold circuits 43, 53, 54, each identical to those previously described where the peak of an FID signal or a spin-echo signal is measured and stored corresponding to functions of $\rho$, $T_1$ and $T_2$. Thus three measured intensities are established for each element or isotope. In the particular example where three elements or isotopes are used, we have 9 independent parameters defining the materials. These are then applied to algebraic inverter 44 which inverts the 9×9 matrix and provides a high degree of material selectivity. The resultant material signals can be used to provide a high degree of chemical analysis where a wide range of otherwise similar materials can be cancelled or enhanced in the image.

As shown in FIG. 4, the various elements and isotopes are studied simultaneously. In many cases, however, it is desirable to use a high axial magnetic field for elements other than hydrogen. In that case the signals from the various elements and isotopes can be acquired in sequence where the axial magnetic field is changed for each element. Thus $V_1$ is increased for elements other than hydrogen.

In general, projection measurements are made representing $\rho$, $T_1$, $T_2$ and velocity of different elements and isotopes. The projected components of these measurements are combined to isolate, cancel or identify materials of interest. Of course, for each element or isotope studied, the $V_4$ excitation signal must include energy at that frequency so that signal 31 can include the required FID or spin echo signals corresponding to that element.

Projection images can be accomplished in a variety of ways, using the basic structure of FIG. 1. In one approach an array of planar integrals are formed, each being perpendicular to the projection plane 28. At each angle, the signals from a set of parallel planes are acquired. The angle of the planes are determined by the direction of the gradient field. The total gradient field is a combination of the gradient field in the z direction, driven by signal $V_2$ using coils 18 and 19, and the field in the x direction, driven by signal $V_3$ using coils 23 and 24.

For example, if a voltage is applied to $V_2$, with $V_3$ zero, the gradient field will be solely in the z direction. Therefore each xy plane, perpendicular to the z axis, will experience a different magnetic field and produce a different frequency. When the volume is excited by the broadband r.f. signal $V_4$, these parallel planes will simultaneously provide signals 31. Processor 29 then includes a Fourier transform system, such as a digital FFT (Fast Fourier Transform), to separately extract the signals from each of the parallel planes. This process is repeated with a voltage applied to $V_3$, with $V_2$ zero, providing information about a parallel set of yz planes, each perpendicular to the x-axis. Sets of planes at intermediate angles are acquired by simply using voltage combinations on $V_2$ and $V_3$ to provide gradients at intermediate angles.

All of these planes, at all angles, will be perpendicular to projection plane 28. The integrated activity of each plane is a line projection onto plane 28. The desired projection image is then reconstructed in processor 29 using classic reconstruction from projection techniques. The most common is the convolution back projection system. Thus processor 29 consists of a Fourier transform system to provide the planar signals at all angles, a storage system to store the values at each angle, and a reconstructor to reconstruct the two-dimensional projection image.

One problem with the previous projection imaging system is that all of the planar data must be collected before the image can be reconstructed. This can make the system somewhat sensitive to motion. A preferred embodiment involves the same basic structure in FIG. 1. Here the information for a complete line in projection image 28, representing the lines in a plane in volume 10, can be acquired. The gradient field in the z direction is made time-varying by making $V_2$ an a.c. or time-varying signal. One xy plane, perpendicular to the z axis, will not be time-varying since it will be at the null of the gradient field. Received signal 31 will receive NMR signals from that null plane since the others will not receive the correct excitation. The time-varying gradient can be applied in the transmit and/or the receive mode to average out all but the null plane.

A static gradient is applied in the x direction by applying a constant voltage $V_3$ to coils 23 and 24. Therefore each line in the null plane will produce a different frequency, if excited by burst generator $V_4$. Processor 29 includes a Fourier transform system for taking a transform of the signals from the null plane. Decomposing the signal into different frequencies provides the signals from each line in the plane, or each point in the line on projection plane 28. Thus the output of the Fourier transform system directly provides an array of points along a line in the projection image.

This process is repeated, changing the z position of the null plane. The null plane is determined by that plane where the gradient field induced by a.c. signal $V_2$ is zero. As shown in FIG. 1, with the B terminal on coil 18 connected to the B terminal on coil 19, the null plane will be exactly between the coils since they are driven out of phase. To move the position of the null plane we can ground the upper B terminal on coil 18, and connect a signal $kV_2$ to the lower B terminal on coil 19. With k equal to unity, the null plane will again be between the coils. However, by making k greater than or less than unity, the null plane will move higher and lower respectively. Thus any desired plane can be selected to provide the desired horizontal line image on projection plane 28.

Motion considerations are considerably improved with this data acquisition system. Since the projection image is acquired a line at a time, blurring considerations are based on the acquisition time of each line, rather than the time of the entire image. This approach is therefore preferable in regions of the body, such as the heart, where rapid motions are involved.

The two projection imaging systems just described can be used with any of the previously described systems for measuring the projected amount of components for the materials in volume 10. For example, the excitations shown in FIGS. 2b and 2c can replace the wideband excitations previously described where an array of parallel planes or parallel lines are simultaneously excited. All of the pulse waveforms shown in FIGS. 2b and 2c can be replaced by wideband waveforms which simultaneously provide 90° or 180° excitation over a band of frequencies. These waveforms will have envelopes which have the classic sin x/x shape so that their Fourier transforms will be flat spectra in the regions of interest.

Signal 31 will first be applied to a Fourier transform system to provide an array of signals, each representing a specific frequency region. Each signal will be applied to a sample and hold system 43, using the timing shown in FIGS. 2b and 2c, to provide $I_1, I_2$ and $I_3$ for each frequency representing each projected image of the volume. Thus FIG. 3 represents the processing for one plane in the volume for the first projection imaging system or for one line in a plane of the second projection imaging system using the time-varying gradient. We can thus separate the acquisition of data representing the projection of components of the volume $I_1, I_2$ and $I_3$, and the assembly of these measurements into two-dimensional projection images.

An alternate data acquisition system makes use of the intersection of excited planes. An inversion excitation of 180° inverts the angle of the magnetic spin moment and produces no free induction decay signal. A specific plane, normal to the projection plane 28, can be excited. This plane can then be decomposed into individual lines using the intersection with an array of orthogonal planes, each provided with inversion excitation.

As an example, we use a gradient field in the z direction by applying a voltage $V_2$. As before each xy plane at different z values experiences a different magnetic field and thus represents a different frequency. A particular xy plane can be excited by applying a burst $V_4$ of the appropriate frequency with switch 27 in the transmit position. The amplitude and duration of this burst is adjusted to provide the classical 90° rotation of the magnetic moment. The resultant free induction decay signal is ignored.

We next decompose the selected plane into an array of individual lines perpendicular to the projection plane 28. This forms a line of the desired projection image. The array of lines are formed by an array of yz planes intersecting the saturated xy planes. This array of planes are formed by first applying a voltage $V_3$ to provide a gradient in the x direction so that each yz plane corresponds to a different resonant frequencies. A broadband inverting excitation is then applied using $V_4$. This inverting or 180° excitation will only produce an output at the intersection with the excited xy plane.

The resultant spin echo decay signal 31 is a broadband signal representing the array of intersection lines in the excited xy plane. Processor 29 includes a Fourier transform system for decomposing the signal into its frequency components representing each of the lines of intersection. Each of these lines represents the projection value of a point on projection plane 28. This sequence is repeated for each xy plane by merely changing the frequency of the burst signal $V_4$ when the plane is selected. Thus the complete projection image is formed.

This projection imaging system essentially uses the sequence shown in FIG. 2c where each isolated line of intersection is subjected to a 90° and then 180° excitation, where the amplitude of the spin echo signal $I_3$ represents the line integral of a specific component. However, the $I_1$ signal shown in FIG. 2c cannot be used since it is a part of a planar coincidence sequence which isolated the line. Therefore, measurements of $I_1$ and $I_2$ will have to be accomplished by one of the other projection imaging sequences.

A similar projection imaging system can be used based on a paper by P. Mansfield, A. A. Maudsley and T. Baines entitled, "Fast Scan Proton Density Imaging by NMR," which appeared in the *Journal of Physics E: Scientific Instruments*, 1976, Vol. 9, pp. 271–278. In this method, using a gradient in the z direction, a shaped pulse is used which excites all planes but one section with a 90° spin moment. Then, using a gradient normal to the unexcited plane, another 90° excitation is used. Only the intersection of the two planes produces a received signal following the second excitation.

Referring to FIG. 1, using a gradient field derived from $V_2$, a pulse excitation $V_4$ is used of the form $$V_4 = F^{-1}\left[\frac{\text{rect}(f - f_0)}{a} + \frac{\text{rect}(f + f_0)}{a} - \frac{\text{rect}(f - f_0)}{b} - \frac{\text{rect}(f - f_0)}{b}\right]$$

$$= [a \text{ sinc } at - b \text{ sinc } bt]\cos 2\pi f_0 t,$$

-continued
where $$\text{rect } x = \begin{cases} 1 \text{ for } |x| \leq \frac{1}{2} \\ 0 \text{ for } |x| > \frac{1}{2} \end{cases}$$

$$\text{sinc } x = \frac{\sin \pi x}{\pi x}.$$

where $f_0$ is the center frequency representing the plane being addressed, b represents the thickness of the desired section and a represents the thickness of the entire volume. Thus the excited field is the difference of the two rectangular functions, the large one representing the size of the volume a, and the small one the section thickness b. Following this excitation, a gradient normal to the xy plane is produced by applying a voltage $V_3$. With this gradient a broadband pulse $V_4$ is used which simultaneously excites all of the spin moments in the selected xy plane to the 90° level. The resultant free induction decay signal is Fourier transformed to provide the projection of the lines in the selected plane only. This sequence is then repeated with a new gradient in the z direction to select a new plane.

The amplitude of the free induction decay signal following the second 90° excitation, as in FIG. 2a, represents the desired signal $I_1$. As previously described, this signal is Fourier transformed to simultaneously provide the $I_1$ value for each line in the selected plane. This same imaging approach can be used to measure $I_3$ as shown in FIG. 2c. Following the 90° broadband burst, a 180° broadband burst is used following a time period $t_b$ as shown. The spin echo signal occurring at $2t_b$ is then Fourier transformed to provide the $I_3$ value for all lines. Thus this imaging approach can provide the $I_1$ and $I_3$ projected signals for each line. These are processed, as in FIG. 3, to provide material images.

The final projection imaging method is based on the spin warp imaging method previously described. This is similar to the previous method in that an excited xy plane is decomposed into individual lines. The method of decomposition, however, is distinctly dfferent. Prior to exciting the selected xy plane with burst signal $V_4$, a gradient normal to the plane is applied using voltage $V_3$. This has the affect of periodically "warping" the phase along the x direction. The resultant received signal therefore represents periodic variations in the x direction within the excited xy plane. The spatial frequency of these periodic variations can be altered by changing the strength of the gradient, as represented by voltage $V_3$. By taking a sequence of measurements, each with a different voltage $V_3$, the distribution in the x direction becomes decomposed into its spatial frequency components. Processor 29 can include an inverse Fourier transform to convert this spatial frequency decomposition into the desired line components perpendicular to the projection image 28.

As described, this system, through a sequence of excitations, resulted in the decomposition of the excited plane into lines. As before, this can be repeated for all xy planes. This, however, would represent a relatively long data acquisition time. A preferred approach is the use of a broadband excitation signal $V_4$ which simultaneously excites all of the parallel xy planes. Again, these are each of different frequencies because of the gradient in the z direction introduced by $V_2$. The phase warping gradient in the x direction, produced by $V_3$, will now be simultaneously applied to all xy planes at their individual frequencies. The individual planes are separated in processor 29 using the previously described Fourier transform system to separate the individual frequencies corresponding to each plane. Thus a temporal Fourier transform separates the individual xy planes and a spatial inverse Fourier transform decomposes the lines in the planes.

This spin warp projection imaging system can be used with each of the projection measurement systems of FIGS. 2a, 2b, and 2c. For example, following the broadband 90° excitation the signal is temporally Fourier transformed to divide the signal into different planes. Each planar signal is decomposed into lines using the sequence of spatial patterns followed by a spatial Fourier transform. This provides the $I_1$ signal for each line in the volume, corresponding to a point on projection plane 28.

The single broadband 90° excitation can be replaced by the sequences of FIGS. 2b and 2c, again using broadband excitation for both the 90° and 180° bursts. Then transformed, these provide the desired $I_1$, $I_2$ and $I_3$ signals for the integral or projection of each line in volume 10.

In each of the projection imaging systems described, it is understood that the measurements made can be made at each frequency band corresponding to each element on isotope. That is, referring to FIG. 4, the various operations performed on signal 31, for a specific element, can be performed on signals 55, 56 and 57 for a variety of isotopes and elements which resonate at different frequencies.

A number of other data acquisition systems described in the literature, can be used if modified for the projection mode. Again, each projection system is used to provide line integral measurements of different components of the different materials.

Each of the basic data acquisition systems described have been used as parts of complex data acquisition systems to provide three-dimensional cross-sectional images. In this invention, however, these data acquisition systems have been modified to provide two-dimensional projection images of the volume 10 with all of the aforementioned advantages of faster data acquisition, better SNR, higher resolution, less sensitivity to artifacts, relaxed requirements on the uniformity of the magnetic fields and a much larger and more appropriate field of view.

As described, projections were obtained at a specific projection angle in the y direction onto plane 28. In many diagnostic studies it is desired to obtain projection images at more than one angle. This can be accomplished by rotating the entire structure in FIG. 1. Alternatively, an additional set of coils can be used perpendicular to coils 23 and 24 and parallel to projection plane 28. These can be used, in lieu of coils 23 and 24, to provide a projection image in an orthogonal plane.

In the previous description, undesired intervening structures were removed by taking weighted sums of specific components of the projection images. An alternate general approach is to acquire projection measurements of portions of volume 10, thus avoiding the undesired intervening structures. One general approach is not including these undesired structures in the excited magnetic volume. This can be accomplished by using relatively small coils, 16 and 17 for producing the static field, and positioning them so as to excite only the field of interest. For example, they could be positioned to avoid exciting bony structure 11. This approach has the undesired result of various image distortions produced by fringing fields. These are not too severe, however, in projection imaging systems.

A preferable approach is the size and placement of the r.f. excitation coils 21 and 22. These can be placed in any position as long as the axis of the two coils is perpendicular to the z axis. Thus they can be rotated around the z axis and shifted laterally to avoid exciting an undesired intervening structure.

In some cases more elaborate and more exacting methods will be desired for obtaining projection images over specific regions of volume 10. This can be done using two general methods. These methods have been previously described in the literature as parts of three-dimensional imaging systems. Here, we use these techniques in unique ways to limit the volume over which the projection images are taken.

One general approach is related to a paper by D. Hoult entitled, "Rotating Frame Zeugmatography," which appeared in the *Phil. Trans. R. Soc. London*, B289, 1980, pp. 543–547. In this paper the concept is introduced of a gradient in the $B_1$ or radio frequency field. A gradient in the r.f. field means portions of the volume will undergo the desired 90° excitation while other portions will undergo a 180° inversion and produce no signal. In the paper this method is used, as with the spin warp system, to decompose a plane into a variety of cyclical spatial components. In this invention, this property can be used to restrict the volume of interest.

Coils 21 and 22, instead of being driven equally as in FIG. 1, can be driven to provide a gradient of excitation. Point D on coil 21 can be grounded, with point D on coil 22 driven by $kV_4$. The gradient in intensity will depend on k where k is greater than or less than unity, depending on the desired gradient direction. For example, the gradient can be arranged such that the undesired portion of the volume experiences the 180° inversion and produces no signal. Another arrangement is a gradient varying in phase from 0° on one end to 180° on the other. In this case the central region of the volume, having the required 90° excitation, will provide a projection image with the end regions producing no decay signal. More elaborate systems can be used employing sequences of excitation having coarse periodic variations. These can then be stored and combined and used to select any region of volume 10. It should be emphasized, however, that a relatively few such excitations are required as compared to systems employing three-dimensional imaging.

Figure 5:
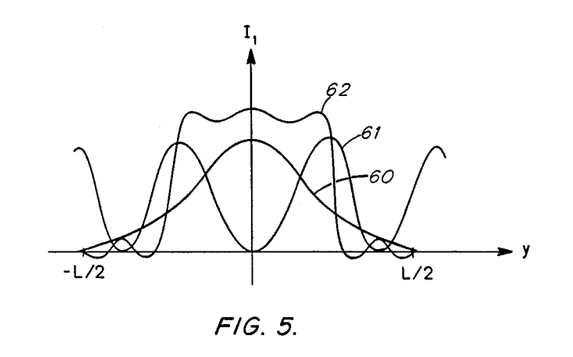
FIG. 5 are graphs illustrating the performance of an embodiment of the invention.

For example, assume it is desirable to excite a region in between the two r.f. excitation coils 21 and 22, but not the entire volume. To provide reasonable isolation of the region of interest, a sequence of three gradient excitations can be applied. Each of these provide values of $B_1$ given by $$B_1 = B_0 + B_G y$$

providing a linearly varying r.f. excitation field. In the first gradient excitation, the values are arranged to vary from 0° at one end of the volume to 90° at the other. This provides an FID signal whose relative amplitude $I_1$ is given by curve 60 in FIG. 5. As is seen, the resultant signal is primarily from the center at the volume, around $y=0$. However, the resultant selectivity is not very sharp, so that undesired intervening structures near the ends of the volume, at $y = \pm L/2$, will produce some output.

The spatial selectivity can be improved by acquiring one or two more signals with different $B_1$ gradients. For example, we add a second set of excitation waveforms on coils 22 and 23 so that the magnetic moment angle goes from $-270°$ to $+270°$. This results in a third harmonic variation of regions having maximum and null excitation as shown in curve 61 in FIG. 5. We can use a third excitation, not shown, providing a fifth harmonic distribution where the phase varies from $-450°$ to $450°$. Using classic Fourier series analysis, the result of these two or more excitations can be added, in appropriate weights, to limit the region of excitation to the center of the volume, as shown in curve 62, in FIG. 5. A large variety of variations on this theme can be used to isolate regions of volume 10 using gradients of the $B_1$ excitation.

The selective excitation method described produces a single projection component, $I_1$. In many cases this will provide sufficient since the removal of intervening structures is being accomplished by selectively exciting portions of the volume rather than eliminating structures having specific material properties. In many cases, however, it will be desirable to accomplish both selective excitation and material cancellation or enhancement. For example, referring to FIG. 1, it may prove desirable to eliminate bone 11 through selective excitation, but to isolate or analyze tumor 32 through material enhancement or cancellation.

The other important components, $I_2$ and $I_3$ can be derived using gradient excitation by making use of the property that various portions of the projection are at 90° or 180°. For example, referring to FIG. 2c, we follow each selective gradient excitation after a time $t_b$ with an additional gradient excitation where a 90° excitation is added at each point. Thus each 90° region now becomes 180°, thus producing a spin echo at time $2t_b$. In this way the projection $I_3$ can be obtained. Similarly, if we begin with a 90° excitation added at each point, and excite it after $t_a$ seconds with the additional 90° removed we produce the excitation sequence of FIG. 2b. Initially the 90° regions will be at 180°, so that the removal of a 90° excitation after $t_a$ seconds will produce an FID signal whose peak amplitude is $I_2$. The measurements $I_1$, $I_2$ and $I_3$ are combined, as previously described, to select specific materials within the selected volume.

A second general approach to selecting a portion of the volume involves the concept of saturation. This concept is described in a paper by A. N. Garroway, P. K. Grannell and P. Mansfield entitled, "Image Formation in NMR by a Selective Irradiation process," in *Journal Phys. C: Solid State Physics*, Vol. 7, 1974. Here the spin moments of specific regions are demagnetized by using a "burn" pulse; a 180° inversion pulse having a duration comparable to $T_1$, the spin-lattice relaxation time. The frequency content of this pulse determines the region being saturated. Therefore, $V_4$ can be a saturation pulse having a frequency content representing those regions of volume 10 where the projection image is not desired. The pulse contains no energy at those frequencies corresponding to the desired regions of volume 10. For example, for the $V_4$ signal can be of the form $$V_4 = F^{-1}\left[\frac{\text{rect}(f-f_0)}{C} + \frac{\text{rect}(f-f_0)}{C} - \frac{\text{rect}(f-f_0)}{D} - \frac{\text{rect}(f-f_0)}{D}\right]$$

$$= [C \operatorname{sinc} Ct - D \operatorname{sinc} Dt]\cos 2\pi f_0 t$$

where $f_0$ is the center frequency representing the center of the volume of interest, D represents the frequency range corresponding to the portion of the volume where projection imaging is desired, and C represents the entire frequency range of the volume where $C>D$. Thus those regions corresponding to the frequency ranges from $f_0+D/2$ to $f_0+C/2$ and from $f_0-D/2$ to $f_0-C/2$ will be eliminated.

Of course this $V_4$ signal is applied in the presence of a static gradient introduced by coils 18 and 19, and/or coils 23 and 24. The direction and strength of the gradient determine the portions of the volume that frequencies $f_0-D/2$ and $f_0-C/2$ correspond to using the basic relationship $\omega_0=\gamma H$.

Following this volume-selecting saturation pulse $V_4$, any projection imaging system can be used on the unsaturated volume. Again, the projection imaging system can be used with any of the component selective systems of FIGS. 2a, 2b or 2c.

In general, the techniques used in three-dimensional reconstructions can be used in a limited form to restrict the volume over which the two-dimensional projection is obtained.

What is claimed is:

1. In a method for making selective material projection images of a volume using nuclear magnetic resonance the steps of:
    measuring the two-dimensional projection of a plurality of components of the nuclear magnetic resonance activity; and
    processing these components to produce one or more two-dimensional projection images of specific materials of the volume.

2. The method as described in claim 1 wherein the step of processing the components includes the step of cancelling material in the volume by taking a weighted sum of the measurements.

3. The method as described in claim 1 wherein the step of processing the components includes the step of isolating a material in the volume.

4. The method as described in claim 1 wherein the step of measuring components of the nuclear magnetic resonance activity includes the step of confining the measurements to a region of the volume.

5. In a method for making projection images of selected regions of a volume the steps of:
    measuring the projection of nuclear magnetic resonance activity of selected regions of the volume; and
    processing the measurements to produce projection images of the nuclear magnetic resonance activity of selected regions of the volume.

6. Apparatus for providing selective material projection images of a volume using nuclear magnetic resonance comprising:
    means for measuring the two-dimensional projection of components of the nuclear magnetic resonance activity; and
    means for processing these components to produce one or more two-dimensional projection images of specific materials in the volume.

7. Apparatus as recited in claim 6 wherein one of the measured components is a function of the projected density.

8. Apparatus as recited in claim 6 wherein one of the measured components is a function of $T_1$, the spin-lattice or longitudinal relaxation time.

9. Apparatus as recited in claim 6 wherein one of the measured components is a function of $T_2$, the spin-spin or transverse relaxation time.

10. Apparatus as recited in claims 7, 8 or 9 including means for making measurements at different frequencies representing the resonance of different elements or isotopes.

11. Apparatus as recited in claim 6 wherein the measuring means restricts the projection images to represent a selected region of the volume.

12. Apparatus as recited in claim 6 wherein the means for processing the components includes means for cancelling a specific material by taking a weighted sum of the measurements.

13. Apparatus as recited in claim 6 wherein the means for processing the components includes means for isolating a specific material.

14. Apparatus as recited in claims 6, 12 or 13 wherein the processing means includes means for obtaining weighted sums of functions of the measurements.

15. Apparatus for making projection images of selected regions of a volume comprising:
    means for measuring the projection of nuclear magnetic resonance activity of the selected regions of the volume; and
    means for processing these measurements to produce projection images of the nuclear magnetic resonance activity of selected regions of the volume.

16. Apparatus as recited in claim 15 wherein the measuring means includes means for confining the static magnetic field to selected regions of the volume.

17. Apparatus as recited in claim 15 wherein the measuring means includes means for confining the radio-frequency magnetic field to selected regions of the volume.

18. Apparatus as recited in claim 15 wherein the measuring means includes means for providing a spatial gradient on the amplitude of the radio-frequency magnetic field whereby only selected regions of the volume will experience an excitation which provides an output signal.

19. Apparatus as recited in claim 18 including measuring means for providing a plurality of measurements with different spatial gradients on the radio-frequency field and including processing means for combining these measurements to select regions of the volume.

20. Apparatus as recited in claim 15 wherein the measuring means includes means for providing saturation excitation to non-selected portions of the volume whereby only the selected portions will provide output signals.

21. Apparatus as recited in claims 6 or 15 wherein the means for making projection measurements of the volume includes:

means for collecting a complete array of planar integrals perpendicular to the plane of the projection; and means for processing the array of planar integrals to produce two-dimensional projection images of the volume.

22. Apparatus as recited in claims 6 or 15 wherein the means for making projection measurements of the volume includes:

means for isolating a plane in the volume perpendicular to the projection plane using a time-varying magnetic field gradient having all portions of the volume time varying except the isolated plane;

means for decomposing the plane into an array of lines perpendicular to the projection plane using a static gradient field along the plane where each line produces a different frequency; and means for repeating the same procedure for every plane in the volume to form a projection image.

23. Apparatus as recited in claims 6 or 15 wherein the means for making projection measurements of the volume includes:

means for exciting a first plane perpendicular to the projection plane;

means for exciting planes perpendicular to the first plane and perpendicular to the projection plane whereby signals are received solely from the intersection of the excited planes; and means for repeating this sequence for a series of planes parallel to the first plane.

24. Apparatus as recited in claims 6 or 15 wherein the means for making projection measurements of the volume includes:

means for collecting signals representing an array of parallel planar integrals perpendicular to the projection plane;

gradient means for decomposing each planar integral into cyclical spatial distributions normal to the projection plane;

means for repeating the measurement sequence using cyclical distributions at different spatial frequencies; and means for combining the planar integral signals with different cyclical distributions to produce the projection image.

25. Apparatus as recited in claims 6 or 15 wherein the means for making projection measurements of the volume includes:

means for exciting the volume at all regions except a planar section perpendicular to the projection plane;

means for applying a magnetic gradient normal to the planar section and exciting the volume such that regions outside of the planar section will produce no signal and lines within the planar section perpendicular to the projection plane will produce signals of different frequencies; and means for repeating the sequence for each planar section of the volume.

26. Apparatus as recited in claims 6 or 15 including means for sequentially repeating the projection measurements to form real time images of the activity in the volume.

* * * * *

UNITED STATES PATENT AND TRADEMARK OFFICE
CERTIFICATE OF CORRECTION

PATENT NO. : 4,486,708

DATED : December 4, 1984

INVENTOR(S) : Albert Macovski

It is certified that error appears in the above—identified patent and that said Letters Patent is hereby corrected as shown below:

Col. 2, line 11, "This," should be --Thus,--.

Col. 11, line 55, "image" should be --region--.

Col. 16, line 22, "provide" should be --prove--.

Signed and Sealed this

Sixth Day of August 1985

[SEAL]

Attest:

DONALD J. QUIGG

Attesting Officer     Acting Commissioner of Patents and Trademarks